United States Patent [19]

Moss et al.

[11] Patent Number: 5,546,272

[45] Date of Patent: Aug. 13, 1996

[54] SERIAL FAN COOLING SUBSYSTEM FOR COMPUTER SYSTEMS

[75] Inventors: David L. Moss; Richard S. Mills, both of Austin, Tex.

[73] Assignee: Dell USA, L.P., Austin, Tex.

[21] Appl. No.: 374,441

[22] Filed: Jan. 18, 1995

[51] Int. Cl.$^6$ .................................................. H05K 5/00
[52] U.S. Cl. ........................ 361/687; 361/689; 361/695; 415/66
[58] Field of Search ..................... 361/690, 691, 361/687, 692, 695, 697, 707–709; 415/55.5, 61, 66; 416/128

[56] References Cited

U.S. PATENT DOCUMENTS

| | | | |
|---|---|---|---|
| 2,952,787 | 9/1960 | Moore ..................................... | 416/128 |
| 3,903,404 | 9/1975 | Beall et al. .............................. | 235/152 |
| 4,386,651 | 6/1983 | Reinhard ................................. | 165/104 |
| 4,756,473 | 7/1988 | Takemae et al. ......................... | 236/49 |
| 4,774,631 | 9/1988 | Okuyama et al. ....................... | 361/384 |
| 5,136,465 | 8/1992 | Benck et al. ............................ | 361/695 |
| 5,438,226 | 8/1995 | Kuchta .................................... | 361/687 |

OTHER PUBLICATIONS

"Staggered Logic/Memory Board Configuration for Improved Card Cooling" IBM Technical Disclosure Bulletin; vol. 20, No. 7; Dec. 1977.

*Primary Examiner*—Leo P. Picard
*Assistant Examiner*—Jayprakash N. Gandhi
*Attorney, Agent, or Firm*—Henry N. Garrana; Mark P. Kahler; Michelle M. Turner

[57] ABSTRACT

A cooling subsystem and method for a chassis of a computer system. The cooling subsystem comprises: (1) first and second cooling fans having first and second motors associated therewith for driving the first and second cooling fans, respectively and (2) a common plenum substantially shrouding and providing a pathway for air communication between the first and second cooling fans, the first and second fans cooperating to provide an optimum rate of air flow from without the chassis to within the chassis to provide air exchange within the chassis, the air flow within the chassis being in a predetermined direction to provide directed cooling of a specified device within the chassis, the common plenum allowing the first and second fans to continue to cooperate to provide a minimum air flow to provide a minimum air exchange within the chassis, the air flow remaining in the predetermined direction to continue the directed cooling of the specified device when a selected one of the first and second motors fails.

20 Claims, 5 Drawing Sheets

PRIOR ART

SERIAL FAN COOLING SUBSYSTEM FOR COMPUTER SYSTEMS

TECHNICAL FIELD OF THE INVENTION

The present invention is directed, in general, to computer systems and, more specifically, to a cooling subsystem for computer systems employing plenum-coupled serial cooling fans for redundancy in case a single fan fails.

BACKGROUND OF THE INVENTION

As computer systems grow in speed and shrink in size, power consumed within the computer per unit volume (power density) increases dramatically. Thus, it becomes evermore important to dissipate the heat generated by components within the computer during operation to ensure that the components remain within their normal operating temperature ranges. This reduces a chance that the components fail immediately or have too short a lifetime.

There are two processes by which the heat in computer systems can be dissipated to ensure that the components remain within their normal operating temperature ranges. First, heated air within a chassis of the computer system may be replaced with cool air outside the chassis of the computer system. This is typically known as an air exchange cooling process. Additionally, a specific component may be cooled by directly applying air across the surface of the component. High velocity air immediately applied to the surface of the component raises the convective heat transfer coefficient for the surface of that component, thereby increasing convection cooling with respect to that component. This process is typically known as forced-air-cooling. The computer system may incorporate either process, or a combination thereof, to ensure that the components remain within their normal operating temperature ranges.

In early desktop personal computers, components were passively cooled by radiation or natural convection, the surfaces of the components themselves interfacing directly with still air surrounding the component to transfer heat thereto. Unfortunately, air is not a particularly good conductor of heat. Therefore, in the early desktop computers, the heated air tended to become trapped, creating "hot spots" and acting as a thermal insulator increasing component operating temperature. Eventually, computers were provided with fans to exchange air and force it over the surfaces of the components, decreasing the temperature differential between the surface of the component and the surrounding air to increase the efficiency of heat transfer. The decreased temperature differential overcame some of the poor heat-conducting qualities of air.

Of all components in a computer, the microprocessor central processing unit ("CPU") liberates the most heat during operation of the computer. This springs from its role as the electrical center of attention in the computer. Thus, in prior art computers, motherboards were designed to position the CPU in the flow of air from a cooling fan; other heat-producing components were located away from the CPU to afford maximum cooling of the CPU.

As new generations of microprocessors have arrived, however, this relatively simple scheme has become decidedly inadequate, risking destruction of the CPU. It has become common to associate a heat sink with the CPU to increase the heat-dissipating surface area of the CPU for more effective cooling. Such heat sinks have a plurality of heat-dissipating projections or elements on an upper surface thereof. A lower surface of the heat sink is placed proximate the component and a retention clip is employed to wrap around the heat sink, gripping a lower surface of the component with inward-facing projections.

In addition to the heat sink associated with the CPU, a dedicated CPU cooling fan provides an efficient means to dissipate the heat generated by the CPU. While the primary function of the dedicated fan is to force-cool the CPU, the fan may also act as an air exchanger for the computer system. Typically, such a fan-based system incorporates a "biscuit"-type fan driven by a motor. The dedicated fan in conjunction with the positioning of the CPU within the chassis of the computer system provides the means to force-cool the CPU. Although the fan-based system provides effective component cooling, the fan-based system has draw-backs of its own. Mainly, if the single fan locks up then there is no means to cool the CPU of the computer system because there is no back-up capability built in such fan-based systems. The corollary is that the CPU may overheat causing destruction of the CPU and computer system failure.

A viable solution is to incorporate a secondary, redundant fan into the fan-based cooling system. The evident rational for the redundant fan is to protect the components of the computer system from overheating should the primary fan fail. The redundant fan may be designed strictly as a standby fan, or the redundant fan may be designed to run continuously with the primary fan while the computer system is in standard operation. While the standby fan alterative may provide the greatest back-up security for the fan-based system, this option is not the system of choice for a couple of reasons. First, this option fails to take advantage of the everyday additional cooling capacity the redundant fan offers. Moreover, the market does not support standby systems designed into computer systems without an everyday operational benefit, except in a most critical computer system application.

The second design implementation of a continuously-running redundant fan takes advantage of the additional cooling a second fan offers, while simultaneously fulfilling the ultimate objective for implementing the redundant fan into the fan-based system. Parallel coupling of fans is generally the most efficient in terms of total air flow delivery, but a parallel adaptation is defective for the following reasons.

First, a redundant fan in a parallel position would very likely be by-passed should the primary fan experience a failure. More specifically, the idle primary fan, since it is proximate the secondary fan, short circuits the redundant parallel fan's air flow, because the air takes the path of least resistance. Therefore, the components of the computer system overheat because of the loss of requisite air flow through the computer system. Additionally, a redundant fan in a parallel position does not duplicate the forced-air-cooling capability of the primary fan because the redundant fan is proximate, not axially aligned with, the primary fan. For these reasons, a fan-based cooling system using two fans in parallel does not fulfill the objective for adding a redundant fan and should not be employed in a computer system.

Accordingly, what is needed in the art is a cooling subsystem for a computer system that provides for single fan failure without unduly compromising air exchange or directionality of air flow, thereby maintaining forced-air-cooling of specified components when a single fan has failed. More specifically, what is needed is a cooling subsystem that implements a redundant fan and overcomes the physical limitations inherent in such systems.

SUMMARY OF THE INVENTION

To address the above-discussed deficiencies of the prior art, it is a primary object of the present invention to provide a cooling subsystem for a computer system. The subsystem should allow for failure of a single fan without unduly compromising air exchange capacity or forced-air-cooling of specified components of the computer system.

In the attainment of the above primary object, the present invention provides a cooling subsystem and method for a chassis of a computer system. The cooling subsystem comprises: (1) first and second cooling fans having first and second motors associated therewith for driving the first and second cooling fans, respectively and (2) a common plenum substantially shrouding and providing a pathway for air communication between the first and second cooling fans, the first and second fans cooperating to provide an optimum rate of air flow from without the chassis to within the chassis to provide air exchange within the chassis, the air flow within the chassis being in a predetermined direction to provide directed cooling of a specified device within the chassis, the common plenum allowing the first and second fans to continue to cooperate to provide a minimum air flow to provide a minimum air exchange within the chassis, the air flow remaining in the predetermined direction to continue the directed cooling of the specified device when a selected one of the first and second motors fails.

In a preferred embodiment of the present invention, the first cooling fan is downstream of the second cooling fan and the first and second cooling fans contrarotate. The air flow from the first cooling fan moves in substantial alignment with vanes of the second cooling fan when the second motor fails to thereby lower a pressure differential across the second cooling fan.

The alignment of the first and second cooling fans is commonly referred to a series arrangement. The series coupling of fans creates a disturbance in total air flow delivery because of air flow characteristics and the increased pressure differential realized across the second cooling fan. To maximize the total air flow delivered, the two fans are oriented in a contrarotational direction thereby substantially aligning the vanes of the second fan with the airflow of the first fan. The result is that the serial fans compliment one another providing greater cooling capacity for the computer system. Additionally, the orientation of the fans minimizes the pressure drop across the second fan so that the redundant fan can adequately cool the components of the computer system when one of the motors fail.

In a preferred embodiment of the present invention, the specified device is a microprocessor CPU of the computer system. The CPU is the electrical center of attention in the computer and liberates the most heat during operation of the computer system. As the nucleus of the computer system, forced-air-cooling or directional cooling of the CPU provided by a cooling subsystem with built-in redundancy is a primary objective solved by the present invention.

In a preferred embodiment of the present invention, the first and second motors are coaxially aligned with the first and second cooling fans, respectively. The first and second cooling fans are commonly referred to as biscuit-type fans. More specifically, the vanes or blades of the fan are connected to and supported by a central hub. The hub and vanes that constitute the fan are housed within a common shroud. Within the hub the motors provide the means to drive their respective fans. The design of the cooling subsystem couples the hubs of the first and second cooling fans in the direction of a common axis, thereby providing axial alignment of the driving means for the cooling subsystem.

In a preferred embodiment of the present invention, the chassis includes a air egress port distal from the cooling subsystem. The chassis houses the components of the computer system and the cooling subsystem. The cooling subsystem, working in conjunction with an oppositely positioned port, provides the means to achieve effective heat transfer within the chassis of the computer. The fans direct air across the components and through the computer system in the direction of the port. The heat exits the chassis through the port, or aperture, thereby reducing the temperature within the computer system. Without the distant port to extract the internal heat from the chassis, the fans would build a pressure head within the chassis and only reallocate heat from one component to the next. Under those circumstances, the temperature within the chassis rises leading to a greater likelihood of computer system failure.

In a more preferred embodiment of the present invention, the first and second cooling fans are substantially axially aligned. The first and second cooling fans are coupled in a serial arrangement along a common axis through the center of the hub of each fan. This arrangement aligns the vanes of each fan in a common plane in a single predetermined direction. The axial alignment in conjunction with the contrarotational directional orientation of the fans provide the mechanism by which the cooling system optimizes the air delivery throughout the computer system.

In a preferred embodiment of the present invention, the plenum is comprised of a first portion associated with, and forming a shroud for, the first cooling fan, a second portion associated with, and forming a shroud for, the second cooling fan, and a third, intermediate portion joining the first and second portions.

The plenum provides the environment within the chassis where the cooling subsystem is housed. The plenum forms the shroud for each fan and the interrmdiate area between the first and second fan. The objective of the plenum is to accommodate the cooling system so that the cooling air is forced directionally through fans en-route, dissipating the heat throughout the computer system.

In a preferred embodiment of the present invention, the specified device is mounted to a circuit board, a plane of the circuit board substantially in parallel with the predetermined direction. The circuit board is a sheet of insulating plastic, insulated metal, or ceramic material on which the CPU and other components are mounted within the chassis of the computer system. The circuit board is located in a substantially equivalent plane to the cooling subsystem so that the cooling air is applied directly across the surface of the components of the computer system.

In a preferred embodiment of the present invention, the cooling subsystem further comprises means for detecting a failure of a selected one of the first and second motors. The failure detection system provides an additional layer of protection to the CPU and other components of the computer system by providing a warning to a user. The failure detection system may include a differential pressure sensing transducer positioned in the plenum coupled to a warning circuit with indicating light. The failure detection system may consist of a current sensor embedded in the windings of the motor coupled to a warning circuit with indicating light. Any mechanical or electrical system proficient in discovering a system failure may be implemented into the failure detection system of the present invention.

In a preferred embodiment of the present invention, the computer system is a network server personal computer ("PC"). The network server PC is typically a large microcomputer assigned to handle extensive calculations, file management or other functions for a group of computers in a network. The network may be a local area network ("LAN") dedicated to single small office environment, or a wide area network ("WAN"), made up of several LANs.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
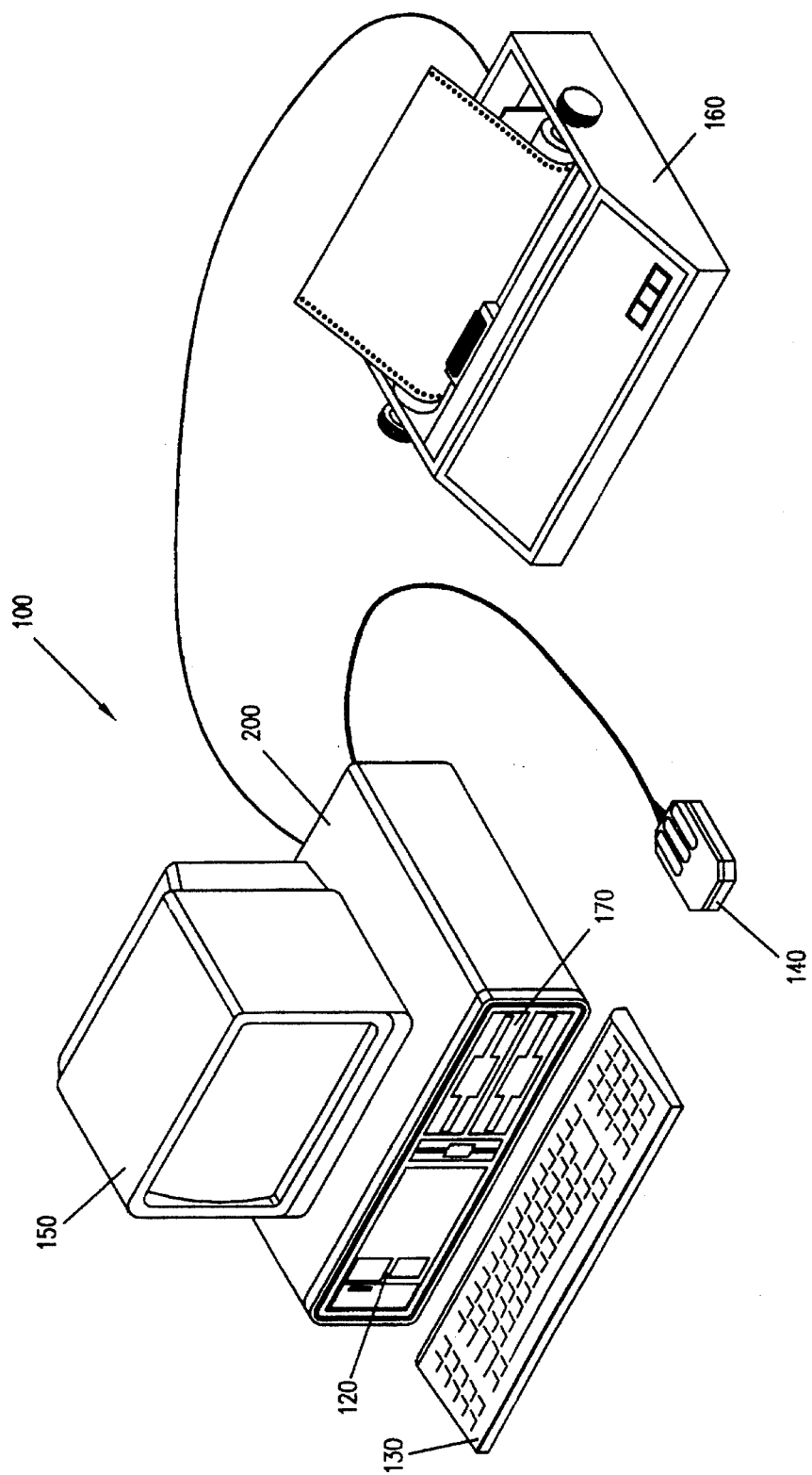
FIG. 1 illustrates an isometric view of a PC providing an environment within which the present, invention may operate.

Referring initially to FIG. 1, illustrated is an isometric view of a PC 100 providing an environment within which the present invention may operate. The PC 100 comprises a chassis 200 containing computer system components to be illustrated and discussed in more detail with regard to FIG. 2. The chassis 200 features, among other things, a reset button 120, a single pole momentary switch used to signal components (e.g. memory and input/output ("I/O") controllers not shown in FIG. 1 ) within the PC 100 to reboot, thereby providing a means of rebooting the PC 100. Coupled through individual connectors on the chassis 200 are a keyboard 130, a mouse 140 and a video monitor 150 (constituting external data input and output devices).

A printer 160 is also shown coupled to the chassis 200. The PC 100 therefore can send character or graphical data to the printer 160 for printing thereby. The peripheral devices 130, 140, 150, 160 allow the PC 100 to interact with a user. FIG. 1 also shows a disk drive 170, allowing permanent storage of computer system data on magnetic media.

The illustrated PC 100 may serve as a network server. As previously discussed, a network server is typically a large microcomputer assigned to handle extensive calculations, FIG. management, or other functions for a group of computers in a network. The network may be a LAN dedicated to single small office environment, or a WAN made up of several LANs.

Figure 2:
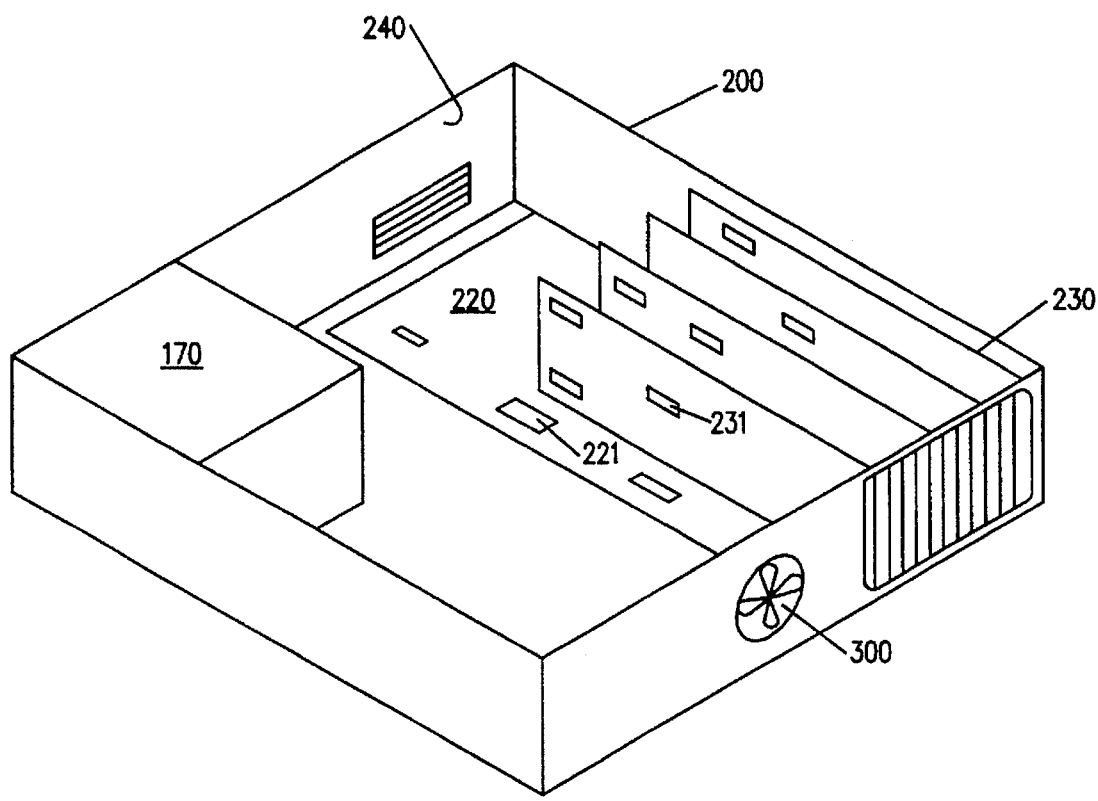
FIG. 2 illustrates a rearside isometric view of an exposed chassis of the PC of FIG. 1 employing g prior art single cooling fan.

Turning now to FIG. 2, illustrated is a rearside isometric view of an exposed chassis of the PC 100 of FIG. 1 employing a prior art single cooling fan 300. The chassis 200 is shown exposed to illustrate the relationship of the several mechanical and electrical components present in a typical chassis 200. A motherboard 220 typically lies in a horizontal orientation proximate a lower surface of the chassis 200. The motherboard 220 is a circuit board comprised of a sheet of insulating plastic or metal, or ceramic material that typically contains a CPU 221 and other computer circuitry central to electrical operation of the computer system. The motherboard 220 is located in a substantially equivalent plane to an axis of the single cooling fan 300.

A plurality of expansion cards 230 are removably inserted into expansion slots (not shown) of the motherboard 220, allowing the computer system to accommodate functional expansion to fit a user's particular needs. The expansion cards 230 typically contain ancillary computer circuitry 231 allowing the computer to, for instance, drive a video display, access disk and tape-based memory, access a network or communicate via a modem.

Figure 3:
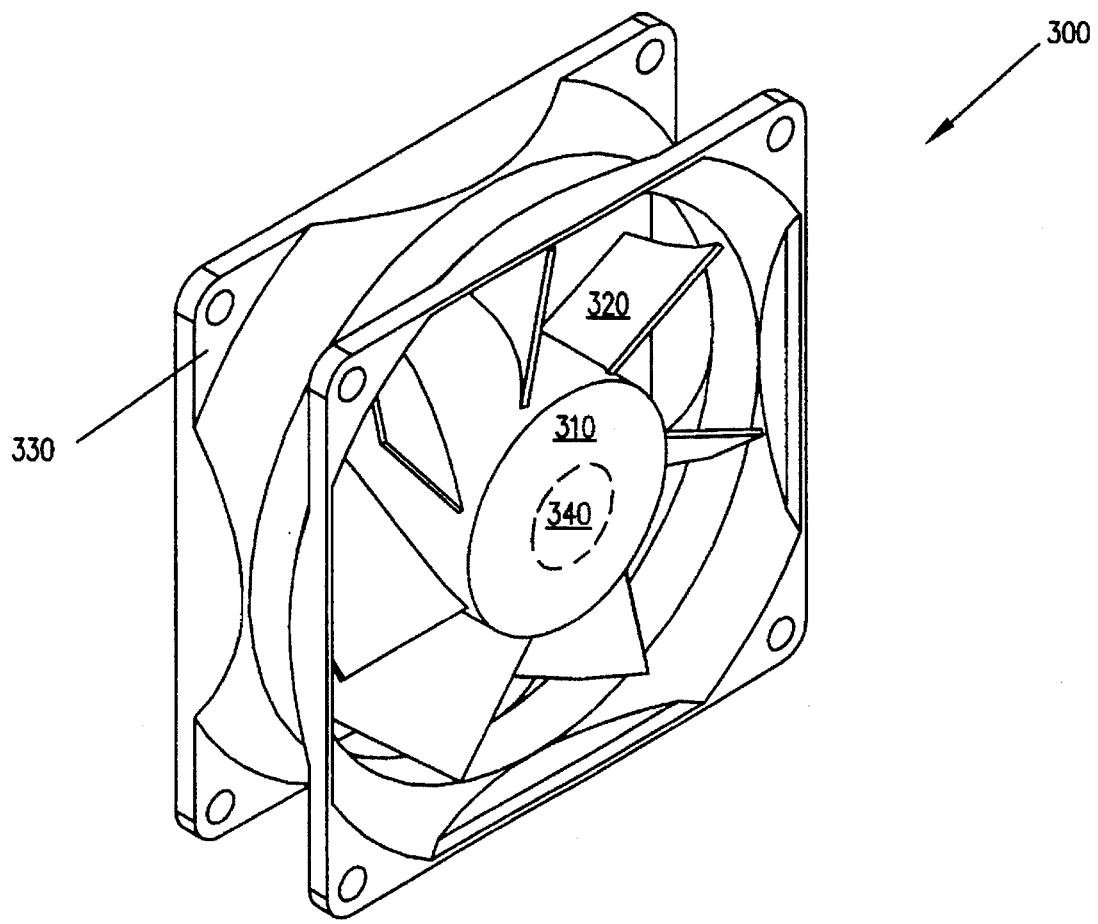
FIG. 3 illustrates an isometric view of a prior art single cooling fan.

As is commonly understood, the CPU 221 and ancillary circuitry 231, and attendant hardware, such as disk and tape drives, need adequate cooling to function properly. Accordingly, it has been conventional for many years to provide a single cooling fan 300 (as shown in FIG. 3) for cooling the CPU 221 and ancillary circuitry 231 and attendant hardware.

As briefly described in the background of the invention, there are two processes by which the heat in computer systems can be dissipated to ensure that the components remain within their normal operating temperature ranges. First, heated air within the chassis 200 may be replaced with cool air from outside the chassis 200. Again, this is typically known as an air exchange cooling process. Additionally, a specific component may be cooled by directly applying air across the surface of the component. High velocity air immediately applied to the surface of the component will raise the convective heat transfer coefficient for the surface of that component, thereby increasing convection cooling with respect to that component. Again, this process is typically known as forced-air-cooling. A computer system may incorporate either process, or a combination therein, to ensure that the components remain within their normal operating temperature ranges.

The CPU or specified device 221 is the electrical center of attention in the computer and liberates the most heat during operation of the computer system. As the nucleus of the computer system, the CPU 221 is typically force-cooled as shown by the orientation of the single cooling fan 300 in the illustrated embodiment. Conversely, the ancillary computer circuitry 231 liberates less heat and as a result the ancillary computer circuitry 231 is cooled by conventional air exchange cooling.

The chassis 200 also includes an air egress port 240 distal from the single cooling fan 300. The single cooling fan 300 working in conjunction with an oppositely-positioned air egress port 240 provides the means to achieve effective heat transfer within the chassis 200 of the PC 100. The single cooling fan 300 directs air across the components and through the computer system in the direction of the air egress port 240. The heat exits the chassis 200 through the air egress port 240, thereby reducing the temperature within the PC 100.

Turning now to FIG. 3, illustrated is an isometric view of a prior art single cooling fan 300. The illustrated single cooling fan 300 is commonly referred to as a "biscuit"-type fan, because the entire fan system is encased within a single housing and it is about the size of a large biscuit. The single cooling fan 300 is comprised of a hub 310 and a plurality of vanes or blades 320 encased in a shroud 330. The vanes 320 of the single cooling fan 300 are driven by a motor 340 enclosed within the hub 310.

The hub 310 provides the central pivoting point or axis around which the vanes 320 rotate. Typically, the hub 310 constitutes a cone-shaped hollow plastic drum and, in a biscuit-type fan, the hub 310 is designed to encase the driving mechanism, or the like, for the single cooling fan 300. The plurality of vanes 320 are comprised of a thin, triangular-shaped composition of plastic slightly arcuated and flanged to the central hub 310. The plurality of vanes 320 rotate or spin in a clockwise or counter-clockwise direction around the hub 310 drawing in air from a rearside of the single cooling fan 300 and delivering air, with an axial component and a rotational component, out the foreside of the single cooling fan 300. Generally, the rearside is adjacent to the point of the cone of the hub 310, and the foreside is adjacent to the circular portion of the hub 310.

The shroud 330 encases the single cooling fan 300. The posterior of the shroud 330 encapsulates the point of the cone of the hub 310 while the anterior of the shroud 330 encapsulates the circular portion of the hub 310. The shroud 330 is circular on the inner portion and square on the outer portion. The inner portion matches the circular cross section created by the hub 310 and the plurality of vanes 320. The outer portion, affixed with bolt holes, is designed to be flanged to the chassis 200 of the PC 100. The shroud 330 also includes support members (not shown) that fix the hub 310 within the center of the inner portion of the shroud 330.

The motor 340 housed in the hub 310 is designed to convert electrical energy into mechanical energy by utilizing forces exerted by magnetic fields produced by current supplied to the motor 340. The motor 340 is directly coupled to a driving mechanism that rotates the vanes 320 around the hub 310. The direct drive system used in the present embodiment replaces the necessity for belts or gears employed in belt-driven or gear-driven systems, respectively.

The single cooling fan 300 illustrated in the present embodiment is commonly used in prior art computers to force-cool specific components and provide air exchange cooling for computer systems.

Figure 4:
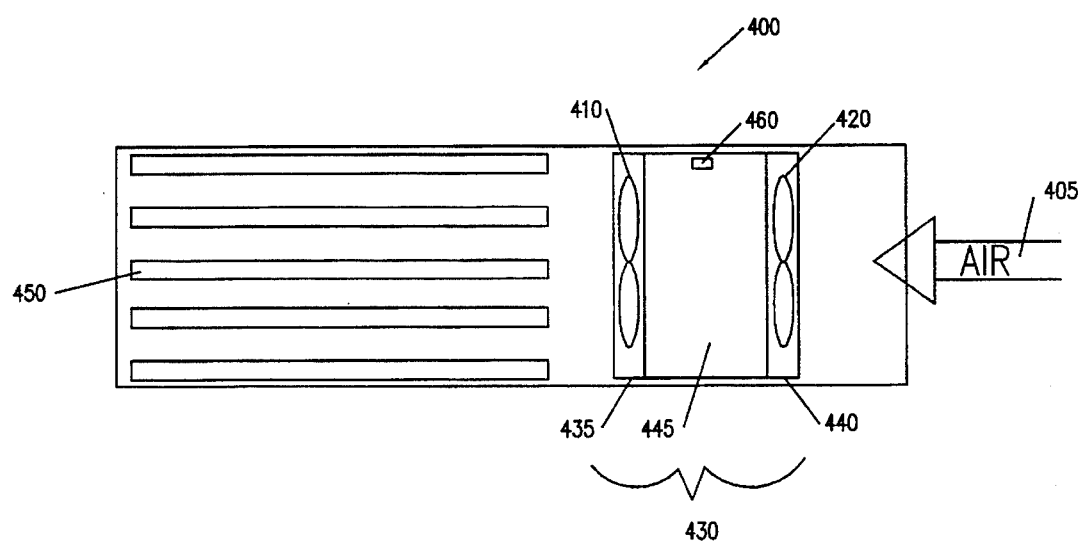
FIG. 4 illustrates a schematic representation of a cooling subsystem of the present invention.

Turning now to FIG. 4, illustrated is a schematic representation of a cooling subsystem 400 of the present invention. The cooling subsystem 400 is comprised of a first cooling fan 410 and a second cooling fan 420 having first and second motors (not shown) associated therewith for driving the first cooling fan 410 and the second cooling fan 420, respectively. The first and second fans 410, 420 are preferably conventional biscuit-type fans as previously discussed in reference to FIG. 3. A common plenum 430 provides the environment within the chassis 200 where the cooling subsystem 400 is housed. The common plenum 430 is comprised of a first cooling fan shroud 435, a second cooling fan shroud 440, and a third intermediate section 445 joining the first cooling fan shroud 435 and the second cooling fan shroud 440.

The common plenum 430 provides a pathway for air flow 405 communication between the first cooling fan 410 and second cooling fan 420. The first cooling fan 410 and second cooling fan 420 cooperate to provide an optimum rate of air flow 405 from without the chassis 200 to within the chassis 200 to provide air exchange within the chassis 200. The common plenum 430 also provides a pathway within the chassis 200 in a predetermined direction to provide directed cooling of a printed wiring assembly ("PWA") 450. The PWA 450 is a circuit board with computer components located thereon. The computer components include, without limitation, a CPU 455 or any other specified device.

The first cooling fan 410 is downstream of the second cooling fan 420 and the first cooling fan 410 and second cooling fan 420 are substantially axially aligned. The arrangement of the first and second fans 410, 420 is known as a coaxial arrangement wherein a central hub (not shown) of each fan 410, 420 is mounted on a common axis. This arrangement aligns the vanes (not shown) of the first and second fan 410, 420 in a common plane in a single predetermined direction. The first and second motors (not shown) located within the hubs of their respective first and second fans 410, 420, are also coaxially aligned with the first cooling fan 410 and second cooling fan 420, respectively. The motors provide the means to drive their respective fans 410, 420.

The first cooling fan 410 and second cooling fan 420 preferably contrarotate. The contrarotational orientation of the first and second fans 410, 420 in conjunction with the axial alignment allows the rotational component of the air flow 405 imparted from the second cooling fan 420 to move in substantial alignment with the vanes of the first cooling fan 410, thereby decreasing the pressure drop through the first and second cooling fans 410, 420 when either of the first or second cooling fans 410, 420 are not operational, thereby optimizing the air flow 405 throughout the computer system.

It should be understood that a primary purpose of making the first cooling fan 410 contrarotate in relationship to the second cooling fan 420 is to allow for minimum air flow reduction in the instance when one of the cooling fans is not operational. In situations where both the first and second cooling fans 410, 420 are operational, the contrarotational nature of the fans provides a slight impedance.

The first cooling fan 410 or second cooling fan 420 continues to cooperate to provide a maximum air flow 405 to the computer system when a selected one of the first or second motors fails. The orientation of the first and second fans 410, 420 in conjunction with the axial alignment also contributes to a smaller pressure differential across the cooling subsystem 400 that the first and second fans 410, 420, acting alone, must overcome.

The cooling subsystem 400 is further comprised of a means for detecting a failure of a selected one of the first and second motors. The failure detection system provides an additional layer of protection to the components of the computer system The failure detection means may include a sensing device 460 (such as a differential pressure sensing transducer positioned in the plenum) coupled to a warning circuit with indicating light (not shown). Alternatively, the failure detection system may comprise a current sensor embedded in the windings of the motor coupled to a warning circuit with indicating light. Any mechanical or electrical system proficient in discovering a system failure may be implemented into the failure detection system of the present invention.

Figure 5:
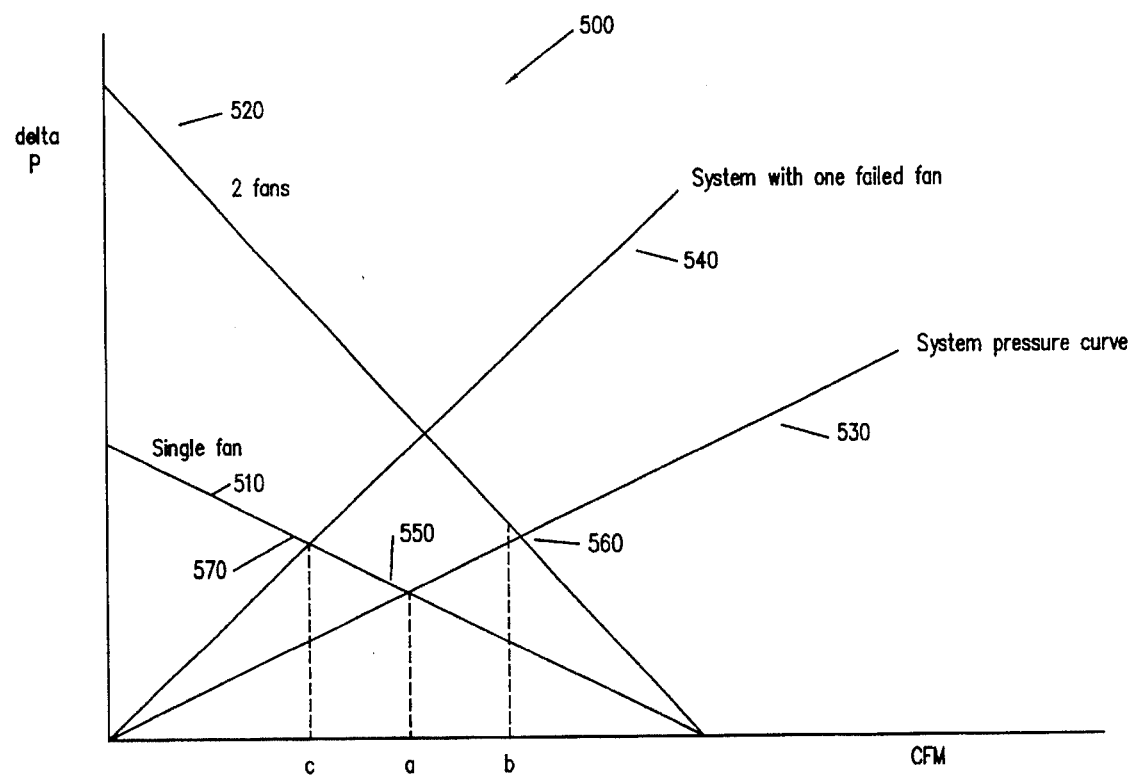
FIG. 5 illustrates a graphical representation of fan and system pressure curves applicable to the present invention.

Turning now to FIG. 5, illustrated is a graphical representation 500 of fan and system pressure curves applicable to the present invention, as hereinafter described. A series arrangement of fans 410, 420 create a disturbance in air flow 405 because of flow characteristics of air in such surroundings and the increased pressure differential realized in the environment.

As previously discussed, the first and second fans 410, 420, in the present invention, are preferably substantially axially aligned in a contrarotational orientation, thereby substantially aligning the vanes of each fan 410, 420. Therefore, the rotational component of the air flow off the second fan 420 enters the open face of the vanes of the first fan 410. This arrangement of the fans 410, 420 maximizes the air delivery when the first fan 410 is locked, as the serial fans 410, 420 compliment one another providing greater cooling capacity for the computer system Additionally, the orientation of the fans 410, 420 minimizes the pressure drop in the cooling subsystem 400 so that the first cooling fan 410 or second cooling fan 420 can adequately cool the components of the computer system when a selected one of first or second motor fails.

Turning more specifically to FIG. 5, the graphical representation 500 depicts a single-fan fan curve 510, a two-fan-in-series fan curve 520, a system pressure curve 530, and a one-fan-failed system pressure curve 540. The intersections of the fan and system pressure curves 510, 520, 530, 540 represent actual operating points with respect to flow rate, measured in cubic feet-per-minute ("CFM") of air delivered.

As demonstrated in the fan and system pressure curves 510, 520, 530, 540, the flow rate of air delivered is a function of the pressure drop (impedance or delta "P") that the fans 410, 420 must overcome. The lower the pressure drop across the fans 410, 420, the larger capacity of air the fans 410, 420 can deliver. Conversely, as shown on the superimposed system curves 530, 540, the larger the pressure drop in the system the greater the CFM of air required to overcome the system pressure.

Point "a" 550 (the intersection of the single-fan fan curve 510 and the system pressure curve 530) represents operation of a system with a single cooling fan (as described with respect to FIGS. 2 and 3). Point "b" 560 (the intersection of the two-fans-in-series fan curve 520 and the system pressure curve 530) represents the operation point with slightly increased flow for the two fans 410, 420 operating in series. Point "c" 570 (the intersection of the single-fan fan curve 510 and the one-fan-failed system pressure curve 540) represents the operational point in a failure condition with an increased system back pressure as shown by the one-fan-failed system pressure curve 540 resulting from the working fan having to push or pull air through the added resistance of a locked fan. As seen in the illustrated embodiment, single fan operation with one rotor-locked fan results in a decrease in flow rate for point "a" 550 to point "c" 570. The cooling subsystem 400 of the present invention is designed around point "c" 570 but operates at point "b" 560 under normal operation.

From the above description, it is apparent that the present invention provides a cooling subsystem and method for a chassis of a computer system. The cooling subsystem comprises: (1) first and second cooling fans having first and second motors associated therewith for driving the first and second cooling fans, respectively and (2) a common plenum substantially shrouding and providing a pathway for air communication between the first and second cooling fans, the first and second fans cooperating to provide an optimum rate of air flow from without the chassis to within the chassis to provide air exchange within the chassis, the air flow within the chassis being in a predetermined direction to provide directed cooling of a specified device within the chassis, the common plenum allowing the first and second fans to continue to cooperate to provide a minimum air flow to provide a minimum air exchange within the chassis, the air flow remaining in the predetermined direction to continue the directed cooling of the specified device when a selected one of the first and second motors fails.

Although the present invention and its advantages have been described in detail, those skilled in the art should understand that they can make various changes, substitutions and alterations herein without departing from the spirit and scope of the invention in its broadest form.

What is claimed is:

1. A cooling subsystem for a chassis of a computer system, said computer system having at least one specified device to be cooled, said cooling subsystem comprising:

first and second cooling fans having first and second motors associated therewith for driving said first and second cooling fans, respectively; and a common plenum substantially shrouding and providing a pathway for air communication between said first and second cooling fans, said first and second fans cooperating to provide an optimum rate of air flow from without said chassis to within said chassis to provide air exchange within said chassis, said air flow within said chassis being in a predetermined direction to provide directed cooling of said specified device within said chassis, said common plenum free of said specified device, said common plenum allowing said first and second fans to continue to cooperate to provide a minimum air flow to provide a minimum air exchange within said chassis, said air flow remaining in said predetermined direction to continue said directed cooling of said specified device when a selected one of said first and second motors fails.

2. The cooling subsystem as recited in claim 1 wherein said first cooling fan is downstream of said second cooling fan and said first and second cooling fans contrarotate, air flow from said first cooling fan moving in substantial alignment with vanes of said second cooling fan when said second motor fails to thereby lower a pressure differential across said second cooling fan.

3. The cooling subsystem as recited in claim 1 wherein said specified device is a microprocessor central processing unit (CPU) of said computer system.

4. The cooling subsystem as recited in claim 1 wherein said first and second motors are coaxially aligned with said first and second cooling fans, respectively.

5. The cooling subsystem as recited in claim 1 wherein said chassis includes a air egress port distal from said cooling subsystem.

6. The cooling subsystem as recited in claim 1 wherein said first and second cooling fans are substantially axially aligned.

7. The cooling subsystem as recited in claim 1 wherein said plenum comprises: a first portion associated with, and forming a shroud for, said first cooling fan; a second portion associated with, and forming a shroud for, said second cooling fan; and a third, intermediate portion joining said first and second portions.

8. The cooling subsystem as recited in claim 1 wherein said specified device is mounted to a circuit board, a plane of said circuit board substantially in parallel with said predetermined direction.

9. The cooling subsystem as recited in claim 1 further comprising means for detecting a failure of a selected one of said first and second motors.

10. The cooling subsystem as recited in claim 1 wherein said computer system is a network server personal computer (PC).

11. A method of providing cooling for a chassis of a computer system, said computer system having at least one specified device to be cooled, said cooling subsystem comprising the steps of:

driving first and second cooling fans with associated first and second motors, respectively; and providing a pathway for air communication between said first and second cooling fans with a common plenum substantially shrouding said first and second fans, said first and second cooling fans cooperating to provide an optimum rate of air flow from without said chassis to within said chassis to provide air exchange within said chassis, said air flow within said chassis being in a predetermined direction to provide directed cooling of said specified device within said chassis, said common plenum free of said specified device, said common plenum allowing said first and second fans to continue to cooperate to provide a minimum air flow to provide a minimum air exchange within said chassis, said air flow remaining in said predetermined direction to continue said directed cooling of said specified device when a selected one of said first and second motors fails.

12. The cooling method as recited in claim 11 wherein said step of driving comprises the step of contrarotating said first and second cooling fans, said first cooling fan being downstream of said second cooling fan, air flow from said first cooling fan moving in substantial alignment with vanes of said second cooling fan when said second motor fails to thereby lower a pressure differential across said second cooling fan.

13. The cooling method as recited in claim 11 wherein said step of providing comprises the step of providing said air flow within said chassis in said predetermined direction to provide directed cooling said specified device, said specified device being a microprocessor central processing unit (CPU) of said computer system.

14. The cooling method as recited in claim 11 further comprising the step of coaxially aligning said first and second motors with said first and second cooling fans, respectively.

15. The cooling method as recited in claim 11 further comprising the step of routing said air through a air egress port in said chassis distal from said cooling subsystem.

16. The cooling method as recited in claim 11 further comprising the step of substantially axially aligning said first and second cooling fans.

17. The cooling method as recited in claim 11 wherein step of providing comprises the step of providing a plenum comprising: a first portion associated with, and forming a shroud for, said first cooling fan; a second portion associated with, and forming a shroud for, said second cooling fan; and a third, intermediate portion joining said first and second portions.

18. The cooling method as recited in claim 11 wherein said step of providing comprises the step of providing said air flow within said chassis in said predetermined direction to provide directed cooling said specified device, said specified device mounted to a circuit board, a plane of said circuit board substantially in parallel with said predetermined direction.

19. The cooling method as recited in claim 11 further comprising the step of detecting a failure of a selected one of said first and second motors.

20. The cooling method as recited in claim 11 wherein said computer system is a network server personal computer (PC).

* * * * *